(12) United States Patent
Liu et al.

(10) Patent No.: US 9,012,126 B2
(45) Date of Patent: Apr. 21, 2015

(54) POSITIVE PHOTOSENSITIVE MATERIAL

(75) Inventors: Weihong Liu, Bridgewater, NJ (US);
PingHung Lu, Bridgewater, NJ (US);
Chunwei Chen, Bridgewater, NJ (US);
Stephen Meyer, Saylorsburg, PA (US);
Medhat Toukhy, Flemington, NJ (US);
SookMee Lai, Kakegawa (JP)

(73) Assignee: AZ Electronic Materials (Luxembourg) S.A.R.L., Luxembourg (LU)

( * ) Notice: Subject to any disclaimer, the term of this patent is extended or adjusted under 35 U.S.C. 154(b) by 0 days.

(21) Appl. No.: 13/524,790

(22) Filed: Jun. 15, 2012

(65) Prior Publication Data
US 2013/0337380 A1  Dec. 19, 2013

(51) Int. Cl.
*G03F 7/039* (2006.01)
*G03F 7/004* (2006.01)

(52) U.S. Cl.
CPC .............. *G03F 7/004* (2013.01); *G03F 7/0392* (2013.01); *G03F 7/0397* (2013.01)

(58) Field of Classification Search
USPC ............................................. 430/270.1–326
See application file for complete search history.

(56) References Cited

U.S. PATENT DOCUMENTS

| | | | |
|---|---|---|---|
| 3,953,408 A | 4/1976 | Hosoi et al. | |
| 4,200,729 A | 4/1980 | Calbo | |
| 4,251,665 A | 2/1981 | Calbo | |
| 4,806,450 A | 2/1989 | Hofmann et al. | |
| 5,187,019 A | 2/1993 | Calbo et al. | |
| 5,968,688 A | 10/1999 | Masuda et al. | |
| 6,210,846 B1 | 4/2001 | Rangarajan et al. | |
| 6,824,947 B2 | 11/2004 | Ishizuka et al. | |
| 6,919,159 B2 | 7/2005 | Matsumoto et al. | |
| 7,255,970 B2 | 8/2007 | Toukhy et al. | |
| 7,601,482 B2 | 10/2009 | Pawlowski et al. | |
| 8,906,594 B2 | 12/2014 | Chen et al. | |
| 2001/0044075 A1 | 11/2001 | Nishimura et al. | |
| 2002/0058199 A1* | 5/2002 | Zampini et al. | 430/270.1 |
| 2002/0061464 A1 | 5/2002 | Aoai et al. | |
| 2003/0235782 A1 | 12/2003 | Padmanaban et al. | |
| 2004/0005513 A1* | 1/2004 | Takahashi et al. | 430/270.1 |
| 2004/0110099 A1 | 6/2004 | Kozawa et al. | |
| 2004/0142280 A1 | 7/2004 | Iwamaga et al. | |
| 2004/0229155 A1 | 11/2004 | Rahman et al. | |
| 2004/0265733 A1 | 12/2004 | Houlihan et al. | |
| 2005/0019691 A1* | 1/2005 | Tseng et al. | 430/270.1 |
| 2005/0019705 A1 | 1/2005 | Thackeray et al. | |
| 2005/0136341 A1 | 6/2005 | Park et al. | |
| 2005/0271974 A1 | 12/2005 | Rahman et al. | |
| 2007/0190465 A1* | 8/2007 | Nishikawa et al. | 430/313 |
| 2008/0076044 A1 | 3/2008 | Mizukawa et al. | |
| 2008/0090172 A1* | 4/2008 | Hatakeyama et al. | 430/270.1 |
| 2009/0176337 A1 | 7/2009 | Kang et al. | |
| 2010/0047715 A1 | 2/2010 | Washio et al. | |
| 2010/0248146 A1* | 9/2010 | Tsuchihashi et al. | 430/286.1 |
| 2011/0081612 A1* | 4/2011 | Fujii et al. | 430/270.1 |
| 2011/0135749 A1 | 6/2011 | Sellinger et al. | |
| 2012/0003437 A1 | 1/2012 | Wada et al. | |
| 2012/0004341 A1 | 1/2012 | Kim et al. | |
| 2012/0141940 A1* | 6/2012 | Shimizu et al. | 430/285.1 |
| 2013/0337381 A1 | 12/2013 | Chen et al. | |

FOREIGN PATENT DOCUMENTS

| | | |
|---|---|---|
| EP | 0 935 171 A1 | 8/1999 |
| GB | 2 415 515 | 12/2005 |
| JP | 8-78318 A | 3/1996 |
| JP | 2009-63824 A | 3/2009 |
| WO | WO 2005/054951 A2 | 6/2005 |
| WO | WO 2007/110773 A2 | 10/2007 |
| WO | WO 2011/046192 A1 | 4/2011 |

OTHER PUBLICATIONS

Specification of U.S. Appl. No. 13/524,811, filed Jun. 15, 2012 with cover page.
Form PCT/ISA/220, Form PCT/ISA/210, and Form PCT/ISA/237 for PCT/EP2013/059771 dated Jul. 29, 2013, which corresponds to U.S. Appl. No. 13/524,790.
Form PCT/ISA/220, Form PCT/ISA/210, and Form PCT/ISA/237 for PCTEP2013059772 dated Jul. 25, 2013, which corresponds to U.S. Appl. No. 13/524,811.

(Continued)

*Primary Examiner* — Cynthia Hamilton
(74) *Attorney, Agent, or Firm* — Sangya Jain

(57) ABSTRACT

The invention relates to a novel positive working photosensitive composition having: at least one photoacid generator; at least one novolak polymer; at least one polymer, having a polymer backbone, said polymer comprising a structure of the following formula:

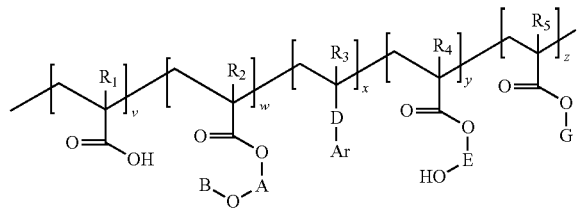

wherein $R_1$-$R_5$ are, independently, —H or —CH$_3$, A is a linear or branched $C_1$-$C_{10}$ alkylene group, B is a $C_1$-$C_{12}$ alkyl or alicyclic group, D is a linking group that may be a chemical bond, a carboxylate group, wherein the carbonyl carbon is bonded to the polymer backbone, or a —COOCH$_2$— group, wherein the carbonyl carbon is bonded to the polymer backbone, Ar is a substituted or unsubstituted aromatic group or heteroaromatic group, E is a linear or branched $C_2$-$C_{10}$ alkylene group, G is an acid cleavable group. The invention further relates to a process for using the novel composition for forming an image.

18 Claims, No Drawings

(56) References Cited

OTHER PUBLICATIONS

Office Action mail date Dec. 21, 2012 for U.S. Appl. No. 13/524,811.
Final Office Action mail date May 31, 2013 for U.S. Appl. No. 13/524,811.
Office Action mail date Dec. 13, 2013 for U.S. Appl. No. 13/524,811.
Office Action mail date Mar. 19, 2014 for U.S. Appl. No. 13/524,811.
Ex parte Quayle Office Action notification date Jul. 17, 2014 for U.S. Appl. No. 13/524,811.
Corrected Notice of Allowability notification date Sep. 30, 2014 for U.S. Appl. No. 13/524,811.
Notice of Allowance and Fee(s) Due date mailed Aug. 14, 2014 for U.S. Appl. No. 13/524,811.

* cited by examiner

POSITIVE PHOTOSENSITIVE MATERIAL

FIELD OF THE INVENTION

The present application for patent relates to a light-sensitive photoresist composition especially useful for imaging thick films.

BACKGROUND

Photoresist compositions are used in microlithography processes for making miniaturized electronic components such as in the fabrication of integrated circuit devices. Generally, in these processes, a coated film of a photoresist composition is applied to a substrate such as silicon wafers used for making integrated circuits, circuit boards and flat panel display substrates. The coated substrate is then baked to evaporate any solvent in the photoresist composition and to fix the coating onto the substrate. The baked coated surface of the substrate is next subjected to an image-wise exposure to actinic radiation.

This actinic radiation exposure causes a chemical transformation in the exposed areas of the coated surface. Visible light, ultraviolet (UV) light, extreme ultraviolet (EUV), electron beam and X-ray radiant energy are radiation types commonly used today in microlithographic processes. After this image-wise exposure, the coated substrate is treated with a developer solution to dissolve and remove either the radiation-exposed areas (for positive-type photoresists) or the unexposed areas (for negative-type photoresists) of the coated surface of the substrate.

After this development operation, the now partially unprotected substrate may be treated with a substrate-etchant solution, plasma gases or reactive ions, or have metal or metal composites deposited in the spaces of the substrate where the photoresist coating was removed during development. The areas of the substrate where the photoresist coating still remains are protected. Later, the remaining areas of the photoresist coating may be removed during a stripping operation, leaving a patterned substrate surface. In some instances, it is desirable to heat treat the remaining photoresist layer, after the development step and before the etching step, to increase its adhesion to the underlying substrate.

In the manufacture of patterned structures, such as wafer level packaging, displays, light emitting diode applications or microelectromechanical systems, electrochemical deposition of electrical interconnects has been used as the interconnect density increases. For example, see Solomon, Electrochemically Deposited Solder Bumps for Wafer-Level Packaging, Packaging/Assembly, Solid State Technology, pages 84-88, April 2001. Gold bumps, copper or other metal posts and copper traces for redistribution in wafer level packaging require a photoresist mold that can later be electroplated to form the final metal structures in advanced interconnect technologies. The photoresist layers are very thick compared to the photoresists used in the IC manufacturing of critical layers. Both feature size and photoresist thickness are typically in the range of 2 μm to 100 μm, (micrometers) so that high aspect ratios (photoresist thickness to line size) have to be patterned in the photoresist.

Positive-acting photoresists comprising novolak polymers and quinone-diazide compounds as photoactive compounds are well known in the art. Novolak polymers may also be reacted with quinone diazides and combined with a polymer. It has been found that photoresists based on only novolak/diazide do not have the photosensitivity or the steepness of sidewalls necessary for certain type of processes, especially for very thick films. Moreover a high dark-film loss in the developer is often observed.

Known chemically amplified photoresists, such as those based on blocked poly-4-hydroxystyrene (PHOST), blocked copolymers comprising hydroxystyrene and a blocked (meth)acrylic acid repeat unit such as tert-butyl(meth)acrylate, or (meth)acrylic materials comprising alicyclic groups, acid cleavable groups, and dissolution modifying groups such as anhydrides or lactones may exhibit the required photosensitivity but may also exhibit adhesion failure, during subsequent unit operations such as plating or etching. Such failures may lead to feature sidewalls that are rough, undercut or have protrusions somewhere in the metal feature. Moreover, these photoresists may be prohibitively expensive.

Therefore, there remains a need for a positive photoresist material that exhibits high photosensitivity, even in thick film applications, requires process worthy development times, exhibits low dark film loss in developers and basic plating solutions, and withstands wet plating and etching operations to produce features that have smooth side walls. The present disclosure and the accompanying claims address these needs.

SUMMARY OF INVENTION

The present invention relates to a novel positive working photosensitive composition comprising: at least one photoacid generator; at least one novolak polymer; at least one polymer, having a polymer backbone, said polymer comprising a structure of the following formula:

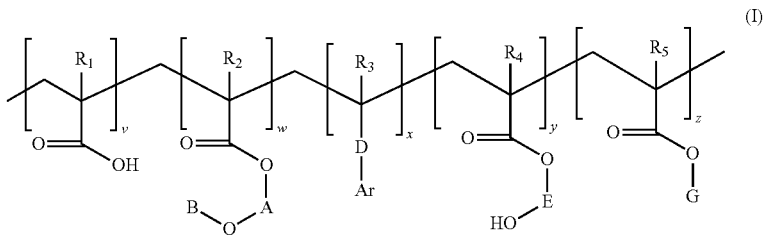

wherein $R_1$-$R_5$ are, independently, —H, F or —$CH_3$, A is a linear or branched $C_1$-$C_{10}$ alkylene group, B is a $C_1$-$C_{12}$ alkyl or alicyclic group, D is a linking group that may be a chemical bond, a carboxylate group, wherein the carbonyl carbon is bonded to the polymer backbone, or a —$COOCH_2$— group, wherein the carbonyl carbon is bonded to the polymer backbone, Ar is a substituted or unsubstituted aromatic group or heteroaromatic group, E is a linear or branched $C_2$-$C_{10}$ alkylene group, G is an acid cleavable group, v is 0-10 mole %, w is 0 mole %-20 mole %, x is 14 mole %-80 mole %, y is 0 mole %-40 mole % and z is 20 mole %-50 mole %. The invention also relates to a method of forming a positive relief image using the novel composition.

DETAILED DESCRIPTION

As used herein, the conjunction "and" is intended to be inclusive and the conjunction "or" is not intended to be exclusive unless otherwise indicated. For example, the phrase "or, alternatively" is intended to be exclusive. The conjunction "or" may also be exclusive when describing chemical substitution at a point on a molecule or molecular fragment. As used herein, the designations (meth)acrylic, (meth)acrylate or the like are intended to denote either methacrylic or acrylic groups. As used herein, novolak polymers are condensation products of phenolic compounds and aldehydes such as formaldehyde, acetaldehyde or substituted or unsubstituted benzaldehydes or condensation products of phenolic compounds and substituted or unsubstituted methylol compounds. As used herein, cresylic novolak polymers are novolak polymers that comprise cresol repeat units. As used herein, the adjective, "exemplary" is intended to indicate an example without indicating preference.

Disclosed and claimed herein is a positive working photosensitive composition comprising: at least one photoacid generator; at least one novolak polymer; at least one polymer, having a polymer backbone, said polymer comprising a structure of the following formula:

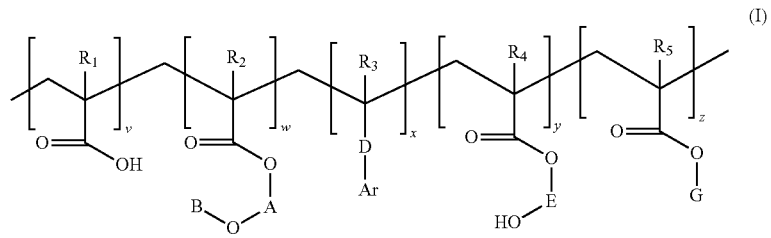

wherein $R_1$-$R_5$ are, independently, —H, F or —$CH_3$, A is a linear or branched $C_1$-$C_{10}$ alkylene group, B is a $C_1$-$C_{12}$ alkyl or alicyclic group, D is a linking group that may be a chemical bond, a carboxylate group, wherein the carbonyl carbon is bonded to the polymer backbone, or a —$COOCH_2$— group, wherein the carbonyl carbon is bonded to the polymer backbone, Ar is a substituted or unsubstituted aromatic group or heteroaromatic group, E is a linear or branched $C_2$-$C_{10}$ alkylene group, G is an acid cleavable group, v is 0-10 mole %, w is 0 mole %-20 mole %, x is 14 mole %-80 mole %, y is 0 mole %-40 mole % and z is 20 mole %-50 mole %. Substituted Ar may be inclusive of an aromatic group substituted with hydroxyl group. Ar may be phenyl or hydroxyphenyl. The general formula above is not meant to show the exact positioning of the component parts of the polymer so that the parts may exist together randomly, as well, 2 or more of the same component part may exist side-by-side in the polymer.

Further disclosed and claimed herein is a method of forming a positive relief image comprising: forming a photosensitive layer by applying a positive working photosensitive composition to a substrate; the positive photosensitive composition comprising: at least one photoacid generator; at least one novolak polymer; at least one polymer, having a polymer backbone, said polymer comprising a structure of the following formula:

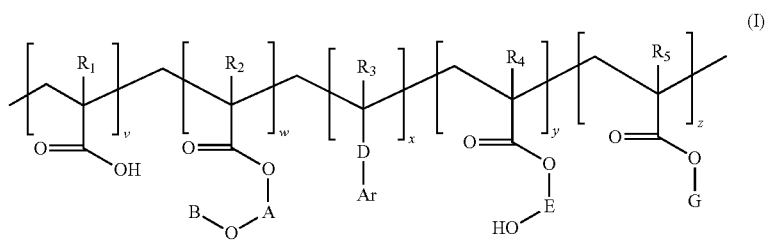

wherein $R_1$-$R_5$ are, independently, —H, F or —$CH_3$, A is a linear or branched $C_1$-$C_{10}$ alkylene group, B is a $C_1$-$C_{12}$ alkyl or alicyclic group, D is a linking group that may be a chemical bond, a carboxylate group, wherein the carbonyl carbon is bonded to the polymer backbone, or a —$COOCH_2$— group, wherein the carbonyl carbon is bonded to the polymer backbone, Ar is a substituted or unsubstituted aromatic group or heteroaromatic group, E is a linear or branched $C_2$-$C_{10}$ alkylene group, G is an acid cleavable group, v is 0-10 mole %, w is 0 mole %-20 mole %, x is 14 mole %-80 mole %, y is 0 mole %-40 mole % and z is 20 mole %-50 mole %; image-wise exposing the photosensitive layer to actinic radiation to form a latent image; developing the latent image in a developer, wherein the image-wise exposed photosensitive layer is optionally thermally treated.

In accordance with the above embodiments, with reference to (I), an exemplary molar percentage range for v may be 0-10%. A further exemplary molar percentage range for v may be 3-8%. A still further exemplary mole percentage range for v may be 4-6%. An exemplary molar percentage range for w may be 0-20%. A further exemplary molar percentage range for w may be 7-15%. A still further exemplary mole percentage range for w may be 9-12%. An exemplary molar percentage range for x may be 14-80%. A further exemplary molar percentage range for x may be 15-30%. A still further exemplary mole percentage range for x may be 16-20%. An exemplary molar percentage range for y may be 0-40%. A further exemplary molar percentage range for y may be 25-35%. A still further exemplary mole percentage range for y may be 28-33%. An exemplary molar percentage range for z may be 20-50%. A further exemplary molar percentage range for z may be 25-40%. A still further exemplary mole percentage range for z may be 29-36%. Mole percentages are not independent in that they must add to 100%.

In accordance with the above embodiments, (I) may be synthesized using one or more feeds of the indicated monomers. At least some of the monomers may be introduced at the beginning of the polymerization reaction in whole or in part. Further, monomer feeds may be accomplished at selected feed rates during the reaction to accommodate different monomer co-reactivities or to control other polymer properties such as molecular weight or solubility. Polymerization may be initiated by free radical initiators, cationic polymerization initiators, anionic polymerization initiators or chelating catalysts.

In accordance with the above embodiments, photoacid generators are present to generate acid upon actinic irradiation. Such photoacid generators can be present alone or in admixture and may be selected in accordance with their ability to generate acid using radiation of a particular wavelength, wavelength range, energy or energy range. Without intending to be bound by theory, it is thought that photoacid generators produce acids by different mechanisms. Accordingly, photoacid generators may be present at selected concentrations, alone or in admixture, to optimize acid output for the selected form of actinic irradiation.

For example, photoacid generators may be present in the solid photoresist film at concentrations from about 1 μmole/g of photoresist solids to about 300 μmole/g (micromoles per gram) of photoresist solids. As a further example, photoacid generators may be present in the solid photoresist film at concentrations from about 5 μmole/g of photoresist solids to about 150 μmole/g of photoresist solids. As a still further example, photoacid generators may be present in the solid photoresist film at concentrations from about 10 μmole/g of photoresist solids to about 75 μmole/g of photoresist solids. As a still further example, photoacid generators may be present in the solid photoresist film at concentrations from about 15 μmole/g of photoresist solids to about 50 μmole/g of photoresist solids.

Photoacid generators may have different chemical compositions. For example, without limitation, suitable photoacid generators may be onium salts, dicarboximidyl sulfonate esters, oxime sulfonate esters, diazo(sulfonyl methyl) compounds, disulfonyl methylene hydrazine compounds, nitrobenzyl sulfonate esters, biimidazole compounds, diazomethane derivatives, glyoxime derivatives, β-ketosulfone derivatives, disulfone derivatives, nitrobenzylsulfonate derivatives, sulfonic acid ester derivatives, imidoyl sulfonate derivatives, halogenated triazine compounds, equivalents thereof or combinations thereof.

Onium salt photoacid generators may comprise, without limitation, alkyl sulfonate anions, substituted and unsubstituted aryl sulfonate anions, fluoroalkyl sulfonate anions, fluoarylalkyl sulfonate anions, fluorinated arylalkyl sulfonate anions, hexafluorophosphate anions, hexafluoroarsenate anions, hexafluoroantimonate anions, tetrafluoroborate anions, equivalents thereof or combinations thereof. Specifically, without limitation suitable photoacid generators may include triphenylsulfonium trifluoromethanesulfonate, triphenylsulfonium nonafluoro-n-butanesulfonate, triphenylsulfonium perfluoro-n-octanesulfonate, and triphenylsulfonium 2-(bicyclo[2.2.1]heptan-2-yl)-1,1,2,2-tetrafluoroethanesulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-(bicyclo[2.2.1]heptan-2-yl)-1,1,2,2-tetrafluoroethanesulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, and 4-methanesulfonylphenyldiphenylsulfonium 2-(bicyclo[2.2.1]heptan-2-yl)-1,1,2,2-tetrafluoroethanesulfonate, diphenyliodonium trifluoromethanesulfonate, diphenyliodonium nonafluoro-n-butanesulfonate, diphenyliodonium perfluoro-n-octanesulfonate, diphenyliodonium 2-(bicyclo[2.2.1]heptan-2-yl)-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-(bicyclo[2.2.1]heptan-2-yl)-1,1,2,2-tetrafluoroethanesulfonate, 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-(bicyclo[2.2.1]heptan-2-yl)-1,1,2,2-tetrafluoroethanesulfonate, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-(bicyclo[2.2.1]heptan-2-yl)-1,1,2,2-tetrafluoroethanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-(bicyclo[2.2.1]heptan-2-yl)-1,1,2,2-tetrafluoroethanesulfonate N-(trifluoromethanesulfonyloxy)bicyclo[2.2.1]hept-5-ene-2,3-dicarboximide, N-(nonafluoro-n-butanesulfonyloxy)bicyclo[2.2.1]hept-5-ene-2,3-dicarboxylmide, N-(perfluoro-n-octanesulfonyloxy)bicyclo[2.2.1]hept-5-ene-2,3-dicarboxylmide, N-[2-(bicyclo[2.2.1]heptan-2-yl)-1,1,2,2-tetrafluoroethanesulfonyloxy]bicyclo[2.2.1]hept-5-ene-2,3-dicarboxylmide, N-[2-(tetracyclo[4.4.0.1$^{2,5}$.1$^{7,10}$]dodecan-3-yl)-1,1-difluoroethanesulfonyloxy]bicyclo[2.2.1]hept-5-ene-2,3-dicarboxylmide, 1,3-dioxoisoindolin-2-yl trifluoromethanesulfonate, 1,3-dioxoisoindolin-2-yl nonafluoro-n-butane sulfonate, 1,3-dioxoisoindolin-2-yl perfluoro-n-octane sulfonate, 3-dioxoisoindolin-2-yl 2-(bicyclo[2.2.1]heptan-2-yl)-1,1,2,2-tetrafluoroethanesulfonate, 3-dioxoisoindolin-2-yl N42-(tetracyclo[4.4.0.1$^{2,5}$.1$^{7,10}$]dodecan-3-yl)-1,1-difluoroethanesulfonate, 1,3-dioxo-1H-benzo[de]isoquinolin-2(3H)-yl trifluoromethanesulfonate, 1,3-dioxo-1H-benzo[de]isoquinolin-2(3H)-yl nonafluoro-n-butane sulfonate, 1,3-dioxo-1H-benzo[de]isoquinolin-2(3H)-yl perfluoro-n-octanesulfonate, 1,3-dioxo-1H-benzo[de]isoquinolin-2(3H)-yl 2-(bicyclo[2.2.1]heptan-2-yl)-1,1,2,2-tetrafluoroethanesulfonate, or 1,3-dioxo-1H-benzo[de]isoquinolin-2(3H)-yl N-[2-(tetracyclo[4.4.0.1$^{2,5}$.1$^{7,10}$]dodecan-3-yl)-1,1-difluoroethanesulfonate, (E)-2-(4-methoxystyryl)-4,6-bis(trichloromethyl)-1,3,5-triazine, 2-(Methoxyphenyl)-4,6-bis-(trichloromethyl)-s-triazine, 2-[2-(Furan-2-yl)ethenyl]-4,6-bis(trichloromethyl)-s-triazine, 2-[2-(5-methylfuran-2-yl]ethenyl)-4,6-bis(trichloromethyl)-s-triazine, 2-[2-(3,4-Dimethoxyphenyl)ethenyl]-4,6-bis(trichloromethyl)-s-triazine, equivalents thereof or combinations thereof. Suitable photoacid generators may also include onium salts comprising anions and cations in combinations not shown supra.

The photosensitive composition disclosed and claimed herein may also comprise photosensitizers that extend the effective wavelength and/or energy range. Such photosensitizers may be, without limitation, substituted and unsubstituted anthracenes, substituted and unsubstituted phenothiazines, substituted and unsubstituted perylenes, substituted and unsubstituted pyrenes, and aromatic carbonyl compounds, such as benzophenone and thioxanthone, fluorene, carbazole, indole, benzocarbazole, acridone chlorpromazine and the like, or combinations of any of the foregoing.

Novolak polymers comprise repeat units having bridges and phenolic compounds. Suitable phenolc compounds include, without limitation, phenols, cresols, substituted and unsubstituted resorcinols, xylenols, substituted and unsubstituted benzene triols and combinations thereof. Novolak polymers are produced, usually, with an acid catalyst, by condensation polymerization of phenolic compounds and aldehydes such as formaldehyde, acetaldehyde or substituted or unsubstituted benzaldehydes or condensation products of phenolic compounds and substituted or unsubstituted methylol compounds. Bridges described supra may comprise methylene groups or methyne groups. Novolak polymers can also be made as condensation products of ketones such as acetone, methyl ethyl ketone, acetophenone and the like. Catalysts may include Lewis acids, Brønstead acids, dicationic and tricationic metal ions and the like. For example, without limitation, aluminum chloride, calcium chloride, manganese chloride, oxalic acid, hydrochloric acid, sulfuric acid, methane sulfonic acid trifluoromethane sulfonic acid or combinations comprising any of the foregoing may be used.

Examples of suitable novolak polymers include those obtained by the condensation reaction between a phenolic compound such as phenol, o-cresol, m-cresol, p-cresol, 2-5-xylenol and the like with an aldehyde compound such as formaldehyde in the presence of an acid or multivalent metal-ion catalyst. An exemplary weight average molecular weight for the alkali-soluble novolak polymer may be in the range from 1,000 to 30,000 Daltons. A further exemplary weight average molecular weight may be from 1,000 to 20,000 Daltons. A still further exemplary weight average molecular weight may be from 1,500 to 10,000 Daltons. Exemplary bulk dissolution rates for novolak polymers in 2.38% aqueous tetramethylammonium hydroxide are 10 Å/sec (Angstrom units per second) to 15,000 Å/sec. Further exemplary bulk dissolution rates are 100 Å/sec to 10,000 Å/sec. Still further exemplary bulk dissolution rates are 200 Å/sec to 5,000 Å/sec. A still further exemplary bulk dissolution rate of 1,000 Å/sec may be obtained from a single novolak polymer or a blend of novolak polymers, each comprising m-cresol repeat units.

Exemplary cresylic novolak polymers may comprise, in cresol mole percentage terms, 0%-60% p-cresol, 0%-20% o-cresol, and 0%-80% m-cresol. Further exemplary cresylic novolak polymers may comprise 0%-50% p-cresol, 0%-20% o-cresol, and 50%-100% m-cresol. Repeat units in novolak polymers are defined by the composition of the polymer, so that, for example, p-cresol may be introduced by polymerization with an aldehyde or by dimethylol-p-cresol. Moreover, cresylic novolak polymers may contain other phenolic compounds such as phenol, xylenols, resorcinols, benzene triols and the like. Further, novolak polymers can be branched or linear and may be blended to achieve a selected repeat unit mole percentage or dissolution rate. Bulk dissolution rates may be measured by the following procedure: (1) A 1-3 μm (micrometer) film of the novolak resin is spin-coated from a solution on a silicon wafer and soft baked at 110° C. for 120 seconds on a contact hot plate. (2) The film thickness is measured using an optical method such as interferometry or elipsometry or a mechanical profilometer. (3) The coated wafer is immersed in a solution of TMAH developer and the time to dissolve completely the novolak film ($t_c$) is detected visually or by means of optical inteferometry (for example, a dissolution rate monitor). The bulk dissolution rate is calculated dividing the film thickness by $t_c$.

Polymers having the general composition (I) may comprise (meth)acrylic repeat units as well as substituted or unsubstituted styrene units. Accordingly, $R_1$-$R_5$ may, independently, be either —H or —$CH_3$.

In (I), supra, exemplary groups for A may be, without limitation, methylene, methylmethylene, ethylene, 1,2-propylene, 2,1-propylene or the like. Exemplary groups for B may be, without limitation, methyl, ethyl, propyl, isopropyl, butyl, isobutyl or the like. Exemplary groups for E may be, without limitation, methylene, methylmethylene, ethylene, 1,2-propylene, 2,1-propylene or the like. Exemplary groups for D may be, —COOCH$_2$—, wherein the carbonyl carbon is bonded to the polymer backbone, a chemical bond or a —COO— group, wherein the carbonyl carbon is bonded to the polymer backbone. Exemplary groups for —Ar may be, without limitation, phenyl, 2-, 3-, or 4-methylphenyl, 2-, 3-, or 4-hydroxyphenyl, 1-, 2-, or 3-naphthyl, or the like. In (I), supra, exemplary acid cleavable groups for G may be, without limitation, a t-butyl group, a tetrahydropyran-2-yl group, a tetrahydrofuran-2-yl group, a 4-methoxytetrahydropyran-4-yl group, a 1-ethoxyethyl group, a 1-butoxyethyl group, a 1-propoxyethyl group, a 3-oxocyclohexyl group, a 2-methyl-2-adamantyl group, a 2-ethyl-2-adamantyl group, a 8-methyl-8-tricyclo[5.2.1.0 2,6]decyl group, a 1,2,7,7-tetramethyl-2-norbornyl group, a 2-acetoxymenthyl group, a 2-hydroxymethyl group a 1-methyl-1-cyclohexylethyl group, a 4-methyl-2-oxotetrahydro-2H-pyran-4-yl group, a 2,3-dimethylbutan-2-yl group, a 2,3,3-trimethylbutan-2-yl group, a 1-methyl cyclopentyl group, a 1-ethyl cyclopentyl group, a 1-methyl cyclohexyl group, 1-ethyl cyclohexyl group, a 1,2,3,3-tetramethylbicyclo[2.2.1]heptan-2-yl group, a 2-ethyl-1,3,3-trimethylbicyclo[2.2.1]heptan-2-yl group, a 2,6,6-trimethylbicyclo[3.1.1]heptan-2-yl group, a 2,3-dimethylpentan-3-yl group, or a 3-ethyl-2-methylpentan-3-yl group.

Exemplary weight average molecular weights of the structure (I) may, without limitation, range from 800 Daltons to 30,000 Daltons. Further exemplary weight average molecular weights of the structure (I) may, without limitation, range from 1,500 Daltons to 20,000 Daltons. Still further exemplary weight average molecular weights of the structure (I) may, without limitation, range from 2,500 Daltons to 20,000 Daltons.

The formulations disclosed and claimed herein comprise both novolak polymers and polymers having the general formula (I). As an example and without limitation, novolak polymers may comprise from 20% to 80% w/w of the total polymer loading. As a further example and without limitation, novolak polymers may comprise from 30% to 75% w/w of the total polymer loading. As a still further example and without limitation, novolak polymers may comprise from 40% to 65% w/w of the total polymer loading.

The photosensitive resin composition disclosed and claimed herein may be used in the form of a solution prepared by dissolving the above described ingredients in a suitable organic solvent. Examples of suitable organic solvents include ketones such as acetone, methyl ethyl ketone, cyclohexanone, methyl isoamyl ketone, methyl amyl ketone, and the like, polyhydric alcohols and derivatives thereof such as monomethyl, monoethyl, monopropyl, monobutyl and monophenyl ethers of ethyleneglycol, ethyleneglycol monoacetate, diethyleneglycol, diethyleneglycol monoacetate, propyleneglycol, propyleneglycol monoacetate, dipropyleneglycol or dipropyleneglycol monoacetate and the like, cyclic ethers such as dioxane, tetrahydrofuran and the like, esters such as methyl lactate, ethyl lactate, methyl acetate, ethyl acetate, butyl acetate and the like and solvents having aromatic groups such as anisole, ethyl benzene, xylenes, chlorobenzene, toluene and the like. Examples are propyleneglycol monomethyl ether acetate, propyleneglycol monomethyl ether and ethyl lactate. These organic solvents can be used either singly or in admixture according to need.

Other optional additives, which have compatibility with and can be added to the composition disclosed and claimed herein according to need, include auxiliary resins, plasticizers, surface leveling agents and stabilizers to improve the properties of the photoresist layer, coloring agents to increase the visibility of the patterned photoresist layer formed by development, antihalation dyes, and the like.

The procedure for the preparation of a patterned photoresist layer by using the photosensitive composition disclosed and claimed herein can be conventional. For example, a substrate such as a semiconductor silicon wafer is evenly coated with the photosensitive composition in the form of a solution by using a suitable coating machine such as a spin-coater followed by baking in a convection oven or on a hotplate to form a photoresist layer which is then exposed pattern-wise to actinic radiation such as deep ultraviolet light, near ultraviolet light, or visible light emitted from low-pressure, high-pressure and ultra-high-pressure mercury lamps, arc lamps, xenon lamps and the like through a photomask bearing a desired pattern on a minifying light-projection exposure apparatus and electron beams scanned in accordance with a desired pattern to build up a latent image of the pattern in the photoresist layer. Thereafter, the latent image in the photoresist layer may optionally be baked in a convection oven or on a hotplate, developed using an alkaline developer solution such as an aqueous solution of tetra($C_1$-$C_4$ alkyl)ammonium hydroxide, choline hydroxide, lithium hydroxide, sodium hydroxide, or potassium hydroxide, for example, tetramethyl ammonium hydroxide, in a concentration of 1 to 10% w/w, to yield a patterned photoresist layer having good fidelity to the pattern of the photomask.

Thicknesses may range from 20 nm to 100 μm. To achieve these thicknesses, a combination of different spin speeds and total solids concentrations may be employed. Depending on the size of the substrate, spin speeds of from 500 rpm to 10,000 rpm may be used. Concentration may be expressed as a percentage w/w of total solids in the photosensitive composition. Without limitation, an exemplary total solids percentage w/w is from 0.05% to 65%. Without limitation, a further exemplary total solids percentage w/w is from 20% to 60%. Without limitation, a further exemplary total solids percentage w/w is from 40% to 55%.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

Synthesis Example 1

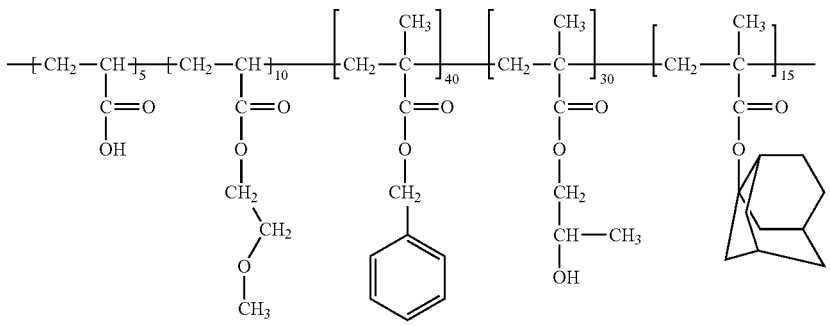

1.8 g of acrylic acid, 6.5 g of methoxyethyl acrylate, 35.2 g of benzyl methacrylate, 21.6 g of hydroxypropyl methacrylate, 16.5 g of adamantyl methacrylate were mixed in 190.6 g of propyleneglycol monomethylether (PGME) solvent. The polymerization reaction proceeded in the presence of 3.3 g of azobisisobutyronitrile [AIBN] at 80° C., under nitrogen for 18 hours. After cooling down to room temperature, the reaction mixture was precipitated in deionized (DI) water. The white polymer solid was washed and dried under vacuum at 45° C., yielding 81.6 g (>99% yield) with a weight average molecular weight of 18,885 Daltons.

Synthesis Example 2

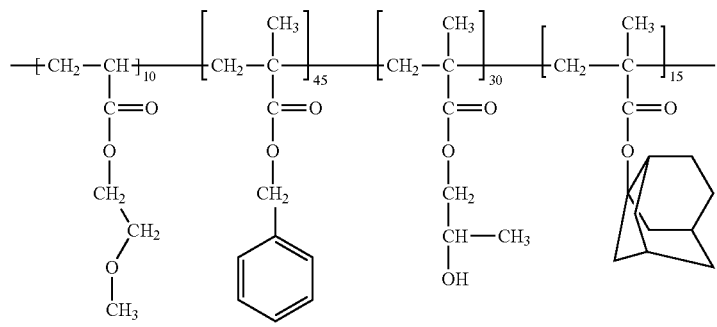

6.5 g of methoxyethyl acrylate, 39.7 g of benzyl methacrylate, 21.6 g of hydroxypropyl methacrylate, 16.5 g of adamantyl methacrylate were mixed in 190.6 g of PGME solvent. The polymerization reaction proceeded in the presence of 3.3 g of AIBN at 80° C., under nitrogen for 18 hours. After cooling down to room temperature, the reaction mixture was precipitated in DI water. The white polymer solid was washed and dried under vacuum at 45° C., yielding 84.3 g (96% yield) with a weight average molecular weight of 10,269 Daltons.

Synthesis Example 3

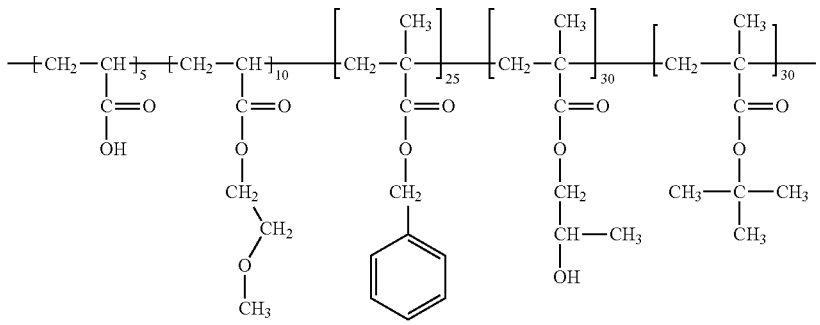

1.8 g of acrylic acid, 6.5 g of methoxyethyl acrylate, 22.0 g of benzyl methacrylate, 21.6 g of hydroxypropyl methacrylate, 21.3 g of tert-butyl methacrylate were mixed in 179.6 g of PGME solvent. The polymerization reaction proceeded in the presence of 3.3 g of AIBN at 80° C., under nitrogen for 18 hours. After cooling down to room temperature, the reaction mixture was precipitated in DI water. The white polymer solid was washed and dried under vacuum at 45° C., yielding 73.5 g (>99% yield) with a weight average molecular weight of 11,868 Daltons.

Synthesis Example 4

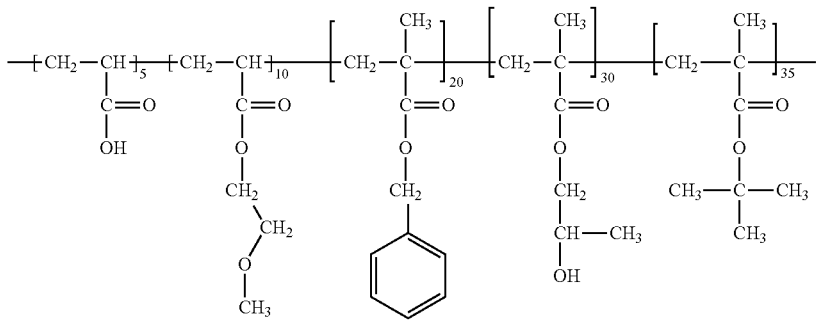

1.8 g of acrylic acid, 6.5 g of methoxyethyl acrylate, 17.6 g of benzyl methacrylate, 21.6 g of hydroxypropyl methacrylate, 24.9 g of tert-butyl methacrylate were mixed in 172.9 g of PGME solvent. The polymerization reaction proceeded in the presence of 1.6 g of AIBN at 90° C., under nitrogen for 18 hours. After cooling down to room temperature, the reaction mixture was precipitated in DI water. The white polymer solid was washed and dried under vacuum at 45° C., yielding 71.6 g (99% yield) with a weight average molecular weight of 17,205 Daltons.

Synthesis Example 5

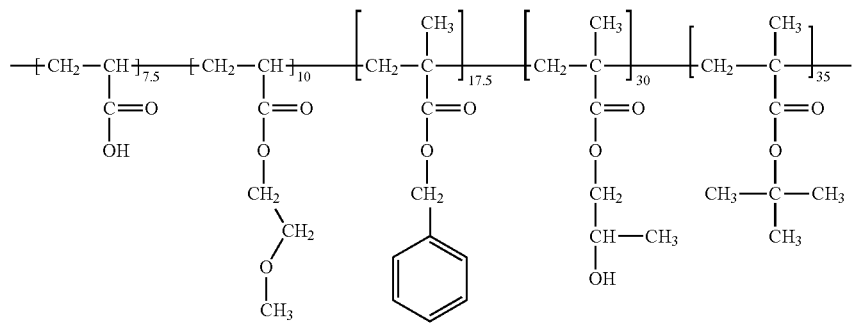

2.7 g of acrylic acid, 6.5 g of methoxyethyl acrylate, 15.4 g of benzyl methacrylate, 21.6 g of hydroxypropyl methacrylate, 24.9 g of tert-butyl methacrylate were mixed in 135.2 g of PGME solvent. The polymerization reaction proceeded in the presence of 1.6 g of AIBN at 90° C., under nitrogen for 18 hours. After cooling down to room temperature, the reaction mixture was precipitated in DI water. The white polymer solid was washed and dried under vacuum at 45° C., yielding 70.3 g (99% yield) with a weight average molecular weight of 17,153 Daltons.

Synthesis Example 6

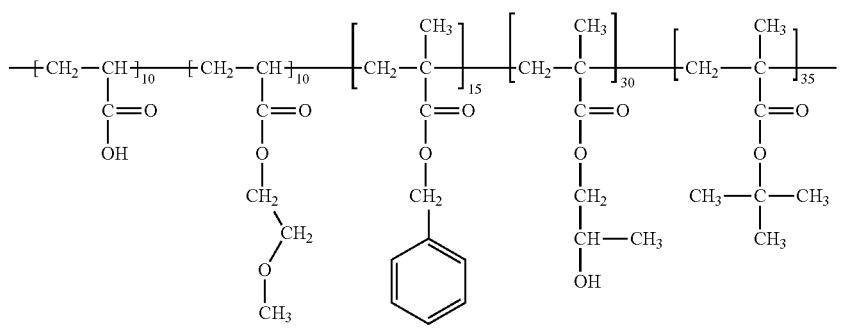

3.6 g of acrylic acid, 6.5 g of methoxyethyl acrylate, 13.2 g of benzyl methacrylate, 21.6 g of hydroxypropyl methacrylate, 24.9 g of tert-butyl methacrylate were mixed in 135.8 g of PGME solvent. The polymerization reaction proceeded in the presence of 3.3 g of AIBN at 90° C., under nitrogen for 18 hours. After cooling down to room temperature, the reaction mixture was precipitated in DI water. The white polymer solid was washed and dried under vacuum at 45° C., yielding 70.8 g (>99% yield) with a weight average molecular weight of 11,913 Daltons.

Synthesis Example 7

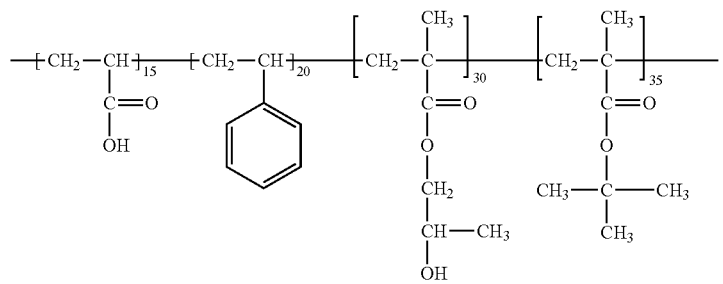

5.4 g of acrylic acid, 10.4 g of styrene, 21.6 g of hydroxypropyl methacrylate, 24.9 g of tert-butyl methacrylate were mixed in 118.7 g of PGME solvent. The polymerization reaction proceeded in the presence of 1.6 g of AIBN at 90° C., under nitrogen for 18 hours. After cooling down to room temperature, the reaction mixture was precipitated in DI water. The white polymer solid was washed and dried under vacuum at 45° C., yielding 63.0 g (99% yield) with a weight average molecular weight of 14,503 Daltons.

Synthesis Example 8

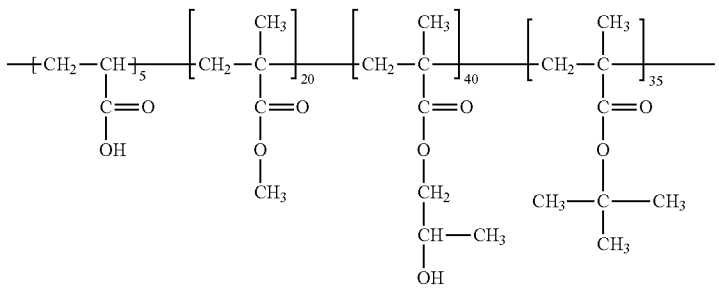

1.8 g of acrylic acid, 10.0 g of methyl methacrylate, 28.8 g of hydroxypropyl methacrylate, 24.9 g of tert-butyl methacrylate were mixed in 124.7 g of PGME solvent. The polymerization reaction proceeded in the presence of 1.6 g of AIBN at 90° C., under nitrogen for 18 hours. After cooling down to room temperature, the reaction mixture was precipitated in DI water. The white polymer solid was washed and dried under vacuum at 45° C., yielding 64.4 g (98% yield) with a weight average molecular weight of 16,650 Daltons.

Synthesis Example 9

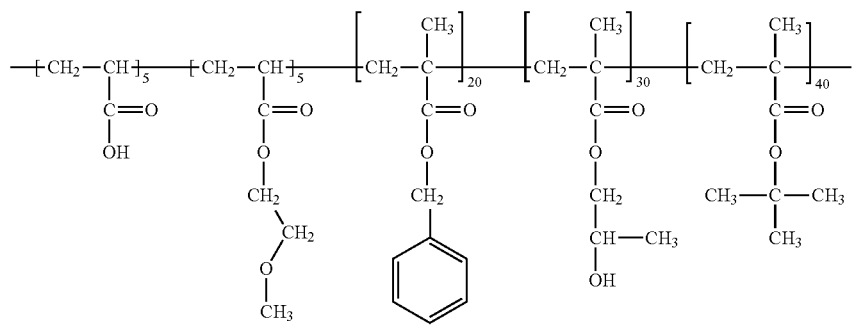

1.8 g of acrylic acid, 3.3 g of methoxyethyl acrylate, 17.6 g of benzyl methacrylate, 21.6 g of hydroxypropyl methacrylate, 28.4 g of tert-butyl methacrylate were mixed in 138.2 g of PGME solvent. The polymerization reaction proceeded in the presence of 1.6 g of AIBN at 90° C., under nitrogen for 18 hours. After cooling down to room temperature, the reaction mixture was precipitated in DI water. The white polymer solid was washed and dried under vacuum at 45° C., yielding 71.9 g (99% yield) with a weight average molecular weight of 15,843 Daltons.

Synthesis Example 10

Novolak Polymers:

For the following formulation examples, three novolak polymers were used. Novolak-1 was synthesized from m-cresol and formaldehyde and had a bulk dissolution rate in 2.38% aqueous TMAH developer of 700 Å/sec. Novolak-2 was synthesized from m-cresol and formaldehyde and had a bulk dissolution rate in 2.38% aqueous TMAH developer of 1,600 Å/sec. Novolak-3 was a 1:1:1 blend of Novolak-1 and Novolak-2, with a bulk dissolution rate in 2.38% aqueous TMAH developer of 1,000 Å/sec.

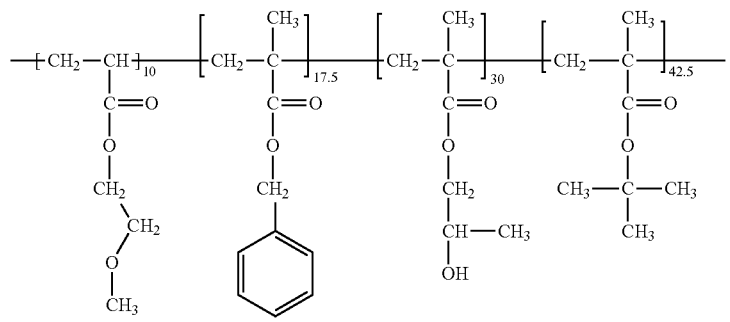

6.5 g of methoxyethyl acrylate, 15.4 g of benzyl methacrylate, 21.6 g of hydroxypropyl methacrylate, 30.2 g of tert-butyl methacrylate were mixed in 140.0 g of PGME solvent. The polymerization reaction proceeded in the presence of 1.6 g of AIBN at 90° C., under nitrogen for 18 hours. After cooling down to room temperature, the reaction mixture was precipitated in DI water. The white polymer solid was washed and dried under vacuum at 45° C., yielding 72.45 g (98% yield) with a weight average molecular weight of 17,525 Daltons.

Synthesis Example 11

Photoresist Processing:
Coating:

All formulations were tested on 8" diameter Si and Cu wafers. The Si wafers were dehydration baked and vapor primed with hexamethyldisilazane (HMDS). The Cu wafers were silicon wafers coated with 5,000 Angstroms of silicon dioxide, 250 Angstroms of tantalum nitride, and 3,500 Angstroms of Cu (PVD deposited).

The photoresist coatings were prepared by spin coating the photoresist samples and applying a soft bake for 300 seconds at 130° C. on standard wafer track hot plate in contact mode. The spin speed was adjusted to obtain 40 micron thick photoresist films. All film thickness measurements were conducted on Si wafers using optical measurements.

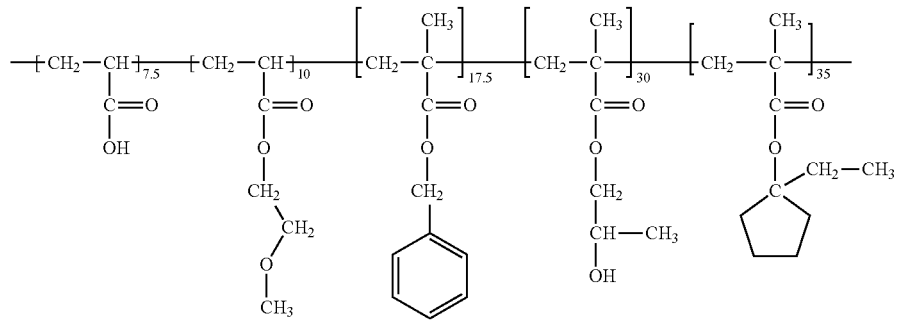

2.7 g of acrylic acid, 6.5 g of methoxyethyl acylate, 15.4 g of benzyl methacrylate, 21.6 g of hydroxypropyl methacrylate, 31.9 g of 1-ethylcyclopentyl methacrylate were mixed in 147.0 g of PGME solvent. The polymerization reaction proceeded in the presence of 1.2 g of AIBN at 90° C., under nitrogen for 18 hours. After cooling down to room temperature, the reaction mixture was precipitated in DI water. The white polymer solid was washed and dried under vacuum at 45° C., yielding 76.33 g (98% yield) with a weight average molecular weight of 16,390 Daltons.

Imaging:

The wafers were exposed on SUSS MA200 CC Mask Aligner. The photoresist was post exposure baked at 100° C. for 100 seconds and puddle developed for 240 seconds in AZ 300 MIF (0.26N aqueous solution of tetramethyl ammoniumhydroxide=TMAH) at 23° C. The developed photoresist images were inspected using Hitachi S4700 or AMRAY 4200L electron microscopes.

Formulation Example 1

10.8 g of the polymer of Synthesis Example 1, 16.3 g of Novolak-3 and 0.34 g of 1,3-dioxo-1H-benzo[de]isoquinolin-2(3H)-yl trifluoromethanesulfonate [also called naphthalene dicarboximidyl triflate, NIT] PAG were dissolved in 28.4 g of PGMEA solvent to make a solution. The solution was coated on silicon and copper wafers for the lithography test. Lithographic results showed that the photoresist pattern did not open completely. It is believed that the adamantyl group did not cleave at the baking temperature of 100° C.

Formulation Example 2

10.8 g polymer of Synthesis Example 2, 16.3 g of Novolak-3 and 0.34 g of NIT PAG were dissolved in 28.4 g of PGMEA solvent to make a solution. The solution was coated on silicon and copper wafers for the lithography test. Lithographic results showed that the pattern did not open completely. It is believed that the adamantyl group did not cleave at the baking temperature of 100° C.

Formulation Example 3

10.8 g polymer of Synthesis Example 3, 16.3 g Novolak-2 and 0.34 g of NIT PAG were dissolved in 28.4 g of PGMEA solvent to make a solution. The solution was coated on silicon and copper wafers for the lithography test. Lithographic results showed good profiles having straight vertical walls and no undercut.

Formulation Example 4

10.8 g polymer of Synthesis Example 4, 16.3 g of Novolak-2 and 0.34 g of NIT PAG were dissolved in 28.4 g of PGMEA solvent to make a solution. The solution was coated on silicon and copper wafers for the lithography test. Lithographic results showed good profiles having straight vertical walls and no undercut.

Formulation Example 5

10.8 g polymer of Synthesis Example 5, 16.3 g of Novolak-3 and 0.34 g of NIT PAG were dissolved in 28.4 g of PGMEA solvent to make a solution. The solution was coated on silicon and copper wafers for the lithography test. Lithographic results showed good profiles having straight vertical walls and no undercut.

Formulation Example 6

10.0 g polymer of Synthesis Example 6, 15.0 g of Novolak-3, 0.18 g of NIT PAG and 0.043 g of tetrabutyl ammonium oxalate were dissolved in 27.4 g of PGMEA solvent to make a solution. The solution was coated on silicon and copper wafers for the lithography test. Lithographic results showed good profiles having straight vertical walls and no undercut.

Formulation Example 7

10.0 g polymer of Synthesis Example 7, 15.0 g of Novolak-3, 0.18 g of NIT PAG and 0.043 g of TBA oxalate were dissolved in 27.4 g of PGMEA solvent to make a solution. The solution was coated on silicon and copper wafers for the lithography test. Lithographic results showed good profiles having straight vertical walls and no undercut. However, coated wafers with this formulation showed cracks in the coated film.

Formulation Example 8

10.0 g polymer of Synthesis Example 8, 15.0 g of Novolak-3, 0.15 g of NIT PAG and 0.020 g of TBA oxalate were dissolved in 27.4 g of PGMEA solvent to make a solution. The solution was coated on silicon and copper wafers for the lithography test. Lithographic results showed good profiles having straight vertical walls and no undercut.

Formulation Example 9

10.0 g polymer of Synthesis Example 9, 15.0 g of Novolak-3, 0.15 g of NIT PAG and 0.020 g of TBA oxalate were dissolved in 27.4 g of PGMEA solvent to make a solution. The solution was coated on silicon and copper wafers for the lithography test. Lithographic results showed good profiles having straight vertical walls and no undercut.

Formulation Example 10

10.0 g polymer of Synthesis Example 10, 15.0 g of Novolak-3, 0.15 g of NIT PAG and 0.020 g of TBA oxalate were dissolved in 27.4 g of PGMEA solvent to make a solution. The solution was coated on silicon and copper wafers for the lithography test. Lithographic results showed opened features having sloped wall profiles.

Although the present invention has been shown and described with reference to particular examples, various changes and modifications which are obvious to persons skilled in the art to which the invention pertains are deemed to lie within the spirit, scope and contemplation of the subject matter set forth in the appended claims.

What is claimed is:

1. A positive working photosensitive composition comprising:
   a) at least one photoacid generator;
   b) at least one novolak polymer, which comprises one or more cresylic repeat units chosen from o-cresol, p-cresol or m-cresol;
   c) at least one polymer, having a polymer backbone, said polymer consisting of a structure of the following formula:

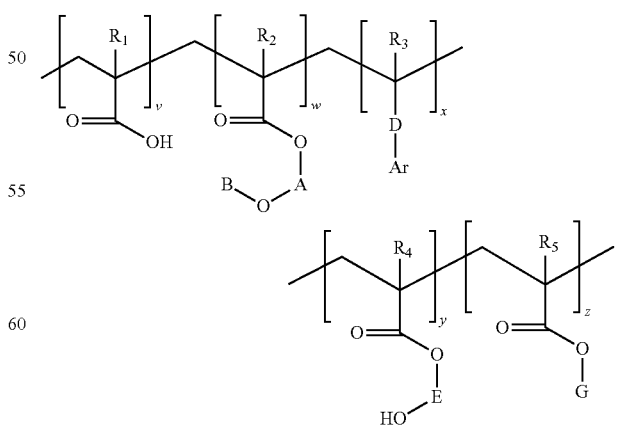

wherein $R_1$-$R_5$ are, independently, —H, F or —CH$_3$, A is an ethylene group or a 1,2-propylene group, B is a $C_1$-$C_{12}$ alkyl or alicyclic group, D is a —COOCH$_2$— group or —COO— group wherein the carbonyl carbon is bonded to the polymer backbone and Ar is a phenyl group, E is a linear or branched $C_2$-$C_{10}$ alkylene group, G is an acid cleavable group, v is 0-10 mole %, w is 7 mole %-15 mole %, x is 14 mole %-80 mole %, y is 25 mole %-35 mole % and z is 20 mole %-50 mole %.

2. The positive working photosensitive material of claim 1, wherein the at least one photoacid generator is an onium salt, a dicarboximidyl sulfonate ester, an oxime sulfonate ester, a diazo(sulfonyl methyl) compound, a disulfonyl methylene hydrazine compound, a nitrobenzyl sulfonate ester, a biimidazole compound, a diazomethane derivative, a glyoxime derivative, a β-ketosulfone derivative, a disulfone derivative, a sulfonic acid ester derivative, an imidoyl sulfonate derivative, or a halogenated triazine compound.

3. The positive working photosensitive composition of claim 1, wherein at least one novolak polymer comprises one or more cresylic repeat units chosen from p-cresol or m-cresol.

4. The positive working photosensitive material of claim 3, wherein at least one novolak polymer is a cresylic novolak comprising at least 80 mole percent m-cresol.

5. The positive working photosensitive composition of claim 1, wherein A is an ethylene group and B is a methyl group, an ethyl group, a propyl group or a butyl group.

6. The positive working photosensitive composition of claim 1, wherein G is an acid cleavable group chosen from the group consisting of a t-butyl group, a tetrahydropyran-2-yl group, a tetrahydrofuran-2-yl group, a 4-methoxytetrahydropyran-4-yl group, a 1-ethoxyethyl group, a 1-butoxyethyl group, a 1-propoxyethyl group, a 3-oxocyclohexyl group, a 2-methyl-2-adamantyl group, a 2-ethyl-2-adamantyl group, a 8-methyl-8-tricyclo[5.2.1.0 2,6]decyl group, a 1,2,7,7-tetramethyl-2-norbornyl group, a 2-acetoxymenthyl group, a 2-hydroxymethyl group, a 1-methyl-1-cyclohexylethyl group, a 4-methyl-2-oxotetrahydro-2H-pyran-4-yl group, a 2,3-dimethylbutan-2-yl group, a 2,3,3-trimethylbutan-2-yl group, a 1-methyl cyclopentyl group, a 1-ethyl cyclopentyl group, a 1-methyl cyclohexyl group, 1-ethyl cyclohexyl group, a 1,2,3,3-tetramethylbicyclo[2.2.1]heptan-2-yl group, a 2-ethyl-1,3,3-trimethylbicyclo[2.2.1]heptan-2-yl group, a 2,6,6-trimethylbicyclo[3.1.1]heptan-2-yl group, a 2,3-dimethylpentan-3-yl group, and a 3-ethyl-2-methylpentan-3-yl group.

7. The positive working photosensitive composition of claim 1, wherein G is an acid cleavable group chosen from a t-butyl group, a 2-methyl-2-adamantyl group, a 2-ethyl-2-adamantyl group, a 8-methyl-8-tricyclo[5.2.1.0 2,6]decyl group, a 1,2,7,7-tetramethyl-2-norbornyl group, a 2-acetoxymenthyl group, a 1-methyl-1-cyclohexylethyl group, a 2,3-dimethylbutan-2-yl group, a 2,3,3-trimethylbutan-2-yl group, a 1-methyl cyclopentyl group, a 1-ethyl cyclopentyl group, a 1-methyl cyclohexyl group, 1-ethyl cyclohexyl group, a 1,2,3,3-tetramethylbicyclo[2.2.1]heptan-2-yl group, a 2-ethyl-1,3,3-trimethylbicyclo[2.2.1]heptan-2-yl group, a 2,6,6-trimethylbicyclo[3.1.1]heptan-2-yl group, a 2,3-dimethylpentan-3-yl group, or a 3-ethyl-2-methylpentan-3-yl group.

8. The positive working photosensitive composition of claim 1, wherein A is a ethylene group, and D is a —COOCH$_2$.

9. The positive working photosensitive composition of claim 8, wherein, when y>0 mole %, E is a 1,2-propylene group.

10. A method of forming a positive relief image comprising:
    a) forming a photosensitive layer by applying the positive working photosensitive composition of claim 1 to a substrate;
    b) image-wise exposing the photosensitive layer to actinic radiation to form a latent image;
    c) developing the latent image in a developer,
    d) wherein the image-wise exposed photosensitive layer is optionally thermally treated.

11. The method of claim 10, wherein the developer comprises at least one compound chosen from tetra (C1-C4 alkyl) ammonium hydroxide, choline hydroxide, lithium hydroxide, sodium hydroxide, or potassium hydroxide.

12. The method of claim 10, wherein the wavelength of the actinic radiation is from about 240 nm to about 450 nm.

13. The positive working photosensitive composition of claim 1 wherein in the polymer's structure formula, v is 3 mole %-8 mole %.

14. The positive working photosensitive composition of claim 1 wherein in the polymer's structure formula, v is 4 mole %-6 mole %, w is 9 mole %-12 mole %, and y is 28 mole %-33 mole %.

15. The positive working photosensitive composition of claim 1 wherein in the polymer's structure formula, w is 9 mole %-12 mole %, and y is 28 mole %-33 mole %.

16. The positive working photosensitive composition of claim 1 wherein the photoacid generator is selected from the group consisting of a dicarboximidyl sulfonate ester, an oxime sulfonate ester, a diazo(sulfonyl methyl) compound, a disulfonyl methylene hydrazine compound, a nitrobenzyl sulfonate ester, a biimidazole compound, a diazomethane derivative, a glyoxime derivative, a β-ketosulfone derivative, a disulfone derivative, a sulfonic acid ester derivative, an imidoyl sulfonate derivative, and a halogenated triazine compound.

17. The positive working photosensitive composition of claim 16 wherein the imidoyl sulfonate derivative is selected from the group consisting of 1,3-dioxoisoindolin-2-yl trifluoromethanesulfonate, 1,3-dioxoisoindolin-2-yl nonafluoro-n-butane sulfonate, 1,3-dioxoisoindolin-2-yl perfluoro-n-octane sulfonate, 3-dioxoisoindolin-2-yl 2-(bicyclo[2.2.1]heptan-2-yl)-1,1,2,2-tetrafluoroethanesulfonate, 3-dioxoisoindolin-2-yl N-[2-(tetracyclo[4.4.0.1$^{2,5}$.1$^{7,10}$] dodecan-3-yl)-1,1-difluoroethanesulfonate, 1,3-dioxo-1H-benzo[de]isoquinolin-2(3H)-yl trifluoromethanesulfonate, 1,3-dioxo-1H-benzo[de]isoquinolin-2(3H)-yl nonafluoro-n-butane sulfonate, 1,3-dioxo-1H-benzo[de]isoquinolin-2(3H)-yl perfluoro-n-octanesulfonate, 1,3-dioxo-1H-benzo[de]isoquinolin-2(3H)-yl 2-(bicyclo[2.2.1]heptan-2-yl)-1,1,2,2-tetrafluoroethanesulfonate, and 1,3-dioxo-1H-benzo[de]isoquinolin-2(3H)-yl N-[2-(tetracyclo[4.4.0.1$^{2,5}$.1$^{7,10}$] dodecan-3-yl)-1,1-difluoroethanesulfonate.

18. The positive working photosensitive composition of claim 16 wherein the imidoyl sulfonate derivative is selected from the group consisting of 1,3-dioxo-1H-benzo[de]isoquinolin-2(3H)-yl trifluoromethanesulfonate, 1,3-dioxo-1H-benzo[de]isoquinolin-2(3H)-yl nonafluoro-n-butane sulfonate, 1,3-dioxo-1H-benzo[de]isoquinolin-2(3H)-yl perfluoro-n-octanesulfonate, 1,3-dioxo-1H-benzo[de]isoquinolin-2(3H)-yl 2-(bicyclo[2.2.1]heptan-2-yl)-1,1,2,2-tetrafluoroethanesulfonate, and 1,3-dioxo-1H-benzo[de]isoquinolin-2(3H)-yl N-[2-(tetracyclo[4.4.0.1$^{2,5}$.1$^{7,10}$]dodecan-3-yl)-1,1-difluoroethanesulfonate.

* * * * *